(12) United States Patent
Wadland et al.

(10) Patent No.: US 8,086,987 B1
(45) Date of Patent: Dec. 27, 2011

(54) METHOD FOR RESOLVING OVERLOADS IN AUTOROUTING PHYSICAL INTERCONNECTIONS

(75) Inventors: Ken Wadland, Grafton, MA (US); William Schilp, Groton, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/188,176

(22) Filed: Jul. 21, 2011

Related U.S. Application Data

(60) Division of application No. 12/325,535, filed on Dec. 1, 2008, which is a continuation of application No. 11/339,562, filed on Jan. 26, 2006, now Pat. No. 7,464,358.

(51) Int. Cl.
*G06F 17/50* (2006.01)
(52) U.S. Cl. ........ 716/126; 716/128; 716/129; 716/130; 716/137
(58) Field of Classification Search .................. 716/126, 716/128, 129, 130, 137
See application file for complete search history.

(56) References Cited

U.S. PATENT DOCUMENTS

| | | | |
|---|---|---|---|
| 6,516,447 B2 | 2/2003 | Wadland et al. | |
| 6,516,455 B1 | 2/2003 | Teig et al. | |
| 6,651,233 B2 | 11/2003 | Teig et al. | |
| 7,017,137 B2 | 3/2006 | Wadland et al. | |
| 7,117,468 B1 | 10/2006 | Teig et al. | |
| 2003/0009738 A1 | 1/2003 | Wadland et al. | |
| 2003/0126578 A1 | 7/2003 | Wadland et al. | |
| 2006/0242614 A1* | 10/2006 | Wadland et al. ................ | 716/12 |

OTHER PUBLICATIONS

W. Dai, et al., "Topological routing in SURF: Generating a rubber-band sketch", Proceedings of the 28th ACM/IEEE Design Automation Conference, 1991, pp. 39-44.
W. Dai, et al., "Routability of a rubber-band sketch", Proceedings of the 28th ACM/IEEE Design Automation Conference, 1991, pp. 45-48.
M. Yu, et al., "Interchangeable Pin Routing with Application to Package Layout", International Conference on Computer Aided Design—ICCAS '96, IEEE, 1996.

* cited by examiner

*Primary Examiner* — Suresh Memula
(74) *Attorney, Agent, or Firm* — Rosenberg, Klein & Lee

(57) ABSTRACT

Overloaded regions in the routing space of a physical network are resolved via a routing procedure composed of a topological routing phase and a geometric routing phase. The overloads are resolved in the topological routing phase where the constraints of routing are less prohibitive. Multiple topological transformations directed toward resolving the overloads are executed in the topological routing phase prior to a geometric arrangement being realized. The topological transformations may be applied concurrently by way of a multi-threaded embodiment of the invention.

8 Claims, 10 Drawing Sheets

METHOD FOR RESOLVING OVERLOADS IN AUTOROUTING PHYSICAL INTERCONNECTIONS

RELATED APPLICATIONS

This application is a Divisional patent application of co-pending application Ser. No. 12/325,535, filed on 1 Dec. 2008 which is a Continuation patent application of application Ser. No. 11/339,562, filed on 26 Jan. 2006, now U.S. Pat. No. 7,464,358. The entire disclosure of the prior application Ser. No. 12/325,535, from which an oath or declaration is supplied, is considered a part of the disclosure of this Divisional application and is hereby incorporated by reference.

BACKGROUND OF THE INVENTION

1. Field of the Invention

The invention disclosed herein is related to the determination of interconnections or paths between terminals of interoperable components. More specifically, the invention is related to resolving layout congestion in a routing or path-finding phase during which spatial restrictions otherwise imposed are temporarily suspended. Such methodology is applicable in such fields as automatic circuit path routing, or autorouting, of printed and integrated circuits.

2. Description of the Prior Art

Electrical circuit autorouters have been in use for decades, the majority of which are geometry-based, in which routing objects are represented by obstacles such as pads, pre-existing wire segments, keep-out regions, etc. Typically, the available routing space is represented by a plurality of polygons, such as rectangles or, occasionally, octagons. These polygons are located at explicit coordinates and the geometric autorouter's path finding routines explore the geometric data associated with these and other objects to find new paths. The exploration may proceed by traversing grids or other shape-based spatial divisions, but always in accordance with the geometry defining the routing space.

Once the potential paths, or routes, have been obtained by the path finding procedures, path resolving procedures correct defects in the routing so that design-rule-correct (DRC) wire segments that form the physical electrical connections will properly fit in the space provided. For example, in certain instances, the path finding procedures may select a potential route between items already placed in the given circuit arrangement where the placement of wire segments on that route would violate congestion constraints. When this occurs, the path resolving procedures may attempt to move an existing item so as to accommodate the desired configuration. The process of moving items to make room for other items is referred to herein as a "shove". Shove procedures in geometric autorouters, where they are implemented, require concurrent manipulation of both terminal pads and wire segments by applying spatial operations directly on the associated geometric information. Unfortunately, moving potentially complex shapes in a geometrically defined routing space can be computationally intensive and therefore, extremely slow.

A small number of autorouters are topology-based, where the routing space is divided into, for example, a plurality of triangles and the routing objects are represented in a topological graph residing in the divided routing space. Although the routing objects are known to have geometric locations and physical dimensions, these attributes do not burden the computations during portions of the topological routing phase. The path finding processes explore the topological routing space using "betweenness" rules, as opposed to geometric "fitting" rules. For example, the path finding procedure of a topological router may consider a particular path as being between two particular topological features, but the exact location in the coordinates of the geometric routing space where the path will ultimately pass between those features might not be exactly known at the time of topological routing. The paths found by the topological router may then be used by a geometric autorouter as base traces on which to create the DRC wire segments.

A topology-based autorouter has the advantage that a topological graph is very fluid. Exact locations in the topological routing space are not essential to the topological routing process, so objects can be moved about freely to accommodate new paths. Overloads can be easily tolerated during early routing passes.

By comparison, the path resolution measures of the geometry-based autorouter must be run immediately after the path finding procedures to avoid corruption of the geometric solution. The ability of a topological autorouter to be fluid, allowing overloads and crossed wires, may be its single most important advantage over geometry-based autorouters. But, to take full advantage of this fluidity, additional processes to resolve overloads must be implemented that operate on the topological graph. Overloads that are not eliminated immediately after the path finding procedures have completed execution are more difficult to resolve in later routing stages. Moreover, the path resolution procedures of a geometric router might not be able to create a DRC geometric solution based on a candidate topological solution in which overloads still exist. Therefore, some overload resolution mechanism is needed in all topology-based autorouters if high completion rates are to be achieved.

Currently, topological autorouting is limited to single-layer applications, where there are no vias (conductive elements electrically coupling different layers). Since vias are not used in single-layer applications, there are few, if any, opportunities to execute shoves to resolve overloads. Vias may be easily relocated by shove operations since they are not spatially tied to any other pad on a layer. Shoving most other pads on a layer is usually impracticable, as the spacing of pads is often fixed by the spacing of the associated component, such as by the package terminals of an integrated circuit. Previously, the only technique available to remove overloads in single-layer applications was to effect a reroute of the circuit with an increased penalty imposed for subsequent routing the path in the overloaded region. The technique works, however, rerouting involves inherently slow path finding routines. Generally, for multi-layer routing, high completion rates cannot be achieved efficiently without applying shoving operations to vias.

In view of the limitations of the prior art, the need is felt for a topological autorouter that is capable of resolving overloads during a topological routing stage of operation, where such routing is fluid. Such an autorouter should permit the shoving of vias, where available, and should include other overload resolving procedures should the shove operation fail or be otherwise impracticable. Only after the resolution of overloads in the topological routing stage should the geometric arrangement of the circuit be established.

SUMMARY OF THE INVENTION

The present invention provides a method for routing interconnection paths between terminals by way of a topological routing phase and a geometric routing phase. The topological routing phase is executed prior to the geometric routing phase and begins by routing a topological graph of an arrangement of the terminals. It is then determined if an overload condition exists in the topological graph and responsive to a positive determination thereof, the method creates a local topological graph corresponding to the portion of the topological graph containing the overload condition. The local topological graph is transformed into a set of transformed candidate graphs by means of a set of topological transformations, which are each operably distinct from one another. One of the transformed candidate graphs is selected in accordance with a predetermined criterion. The topological graph is modified to incorporate topological differences between the selected transformed candidate graph and the original topological graph. A geometric path routing phase is executed thereafter, whereby a geometric arrangement of the arrangement of terminals is routed in accordance with the topological graph.

In another aspect of the invention, a method for providing routes between terminals of a net is provided, which includes a topological routing phase and a geometric routing phase. The topological routing phase is executed prior to the geometric path routing phase, whereby a routing space is tessellated by a plurality of arcs, each of the arcs extending between a corresponding pair of nodes. A topological graph indicative of the net is then routed in the routing space and an occupancy of each of the arcs in the candidate topological graph is determined. If the occupancy is greater than a predetermined threshold, the method creates a context object corresponding to a portion of the topological graph containing the over-occupancy. A plurality of occupancy reducing actions is executed on the context object to produce a plurality of context objects, each of the occupancy reducing actions performing operations distinct from the other occupancy reducing actions. Any of the plurality of context objects that contain an occupancy greater than the threshold is cloned and has executed thereon the plurality of occupancy reducing actions. One of the context objects is selected in accordance with a first predetermined criterion and the topological graph is modified in accordance with the portion of the topological graph corresponding to the selected context object. The geometric routing phase is then executed whereby a geometric arrangement of the network is routed in accordance with the topological graph.

In yet another aspect of the invention, an autorouting system is provided for routing interconnection paths between terminals of a net. The system includes a topological autorouter operable to route a topological graph indicative of a geometric arrangement of the terminals and to detect a portion thereof having an overload condition. The topological router is further operable to form a context object for maintaining information on the portion of the topographical graph. The system includes an object queue operable to store an assemblage of context objects, each of which maintains a corresponding portion of the topological graph containing an overload condition. A thread execution unit is provided that is operable to execute an executable thread for each of the context objects. The execution of threads includes performing a corresponding one of a plurality of occupancy reducing actions on the portion of the topological graph, where each of the occupancy reducing actions manipulates topological features of the portion of the topological graph so as to resolve the overload condition. The manipulation of topological features of each of the occupancy reducing actions is operably distinct one from another. The system includes also a geometric autorouter for routing the interconnection paths in accordance with the topological graph having the overload condition resolved.

DETAILED DESCRIPTION OF PREFERRED EMBODIMENTS

Figure 1:
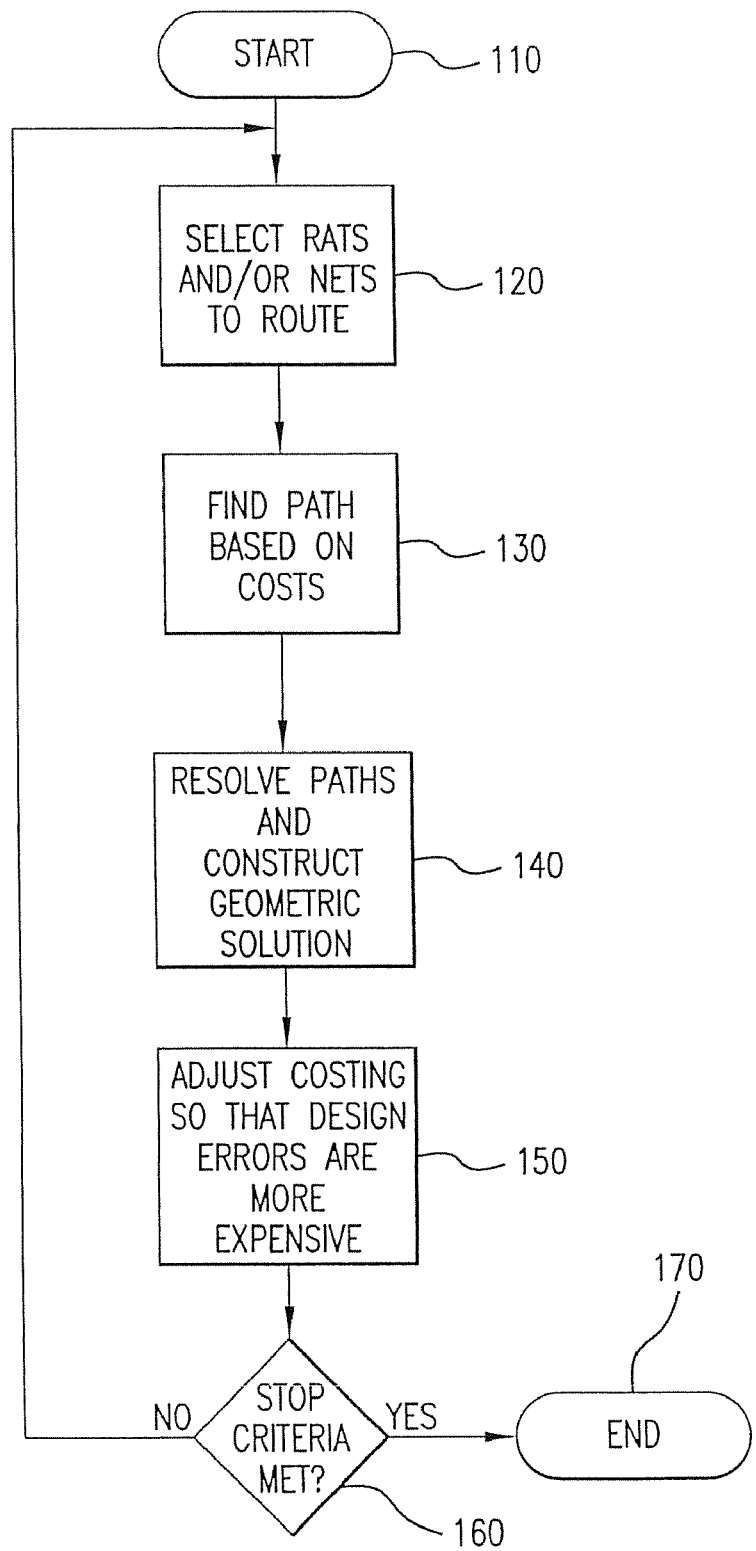
FIG. 1 is a flow diagram of a typical autorouting process.

The circuit routing field has an associated set of teens, several of which will now be defined for purposes of clarity. As used herein, "terminal" is a fixed routable circuit element establishing the beginning or end of an electrical connection. Terminals include pads or pins associated with circuit components, such as integrated circuit packages, and vias, which are conductors, often formed as plated through-holes, completing electrical connections between circuit layers. A "net" is a collection of terminals, all of which are, or must ultimately be, electrically connected to one another by an associated conductive trace. A "rat" defines a connection from one terminal of a net to another. A rat may connect connection points that lie on different circuit layers, whereas a "ratline" is such a connection that is confined to a single circuit layer. The objective of an autorouter is to electrically connect the terminals of a net in the order specified by the rats.

Terminology associated with topological autorouters is consistent with other graphing fields. A "topological graph" is a set of "nodes", points on which the topological graph is defined, linked together by a number of "arcs", lines joining pairs of nodes. A "topological plan" is a topological graph confined to a single topological layer. The topological plan contains a number of "paths", which, as used herein, define a connection between nodes with certain geometric considerations in effect (e.g., two paths cannot occupy the same area of the same plane). A "dot" is a topological point at which an object, such as a path, lies on or crosses an arc.

Each arc in a topological plan has associated therewith information as to which paths are planned to flow between its two nodes, although the spatial order of the paths on the corresponding arc may not be known. A particular arc is known to have "capacity", which is the total space available between its two nodes. The "occupancy" of an arc is the total space consumed by objects currently planned through that arc. The difference between the capacity and the occupancy of an arc is referred to as its "vacancy". If the vacancy of an arc is less than zero, the arc is said to be overloaded.

In modern autorouters, routing solutions are evaluated against some "cost," which is used to determine a routing solution's relative suitability with respect to alternative routing solutions. To implement a cost-based routing procedure, a set of routing metrics are established each defining a characteristic of the route. The routing metrics serve as the functional domain of a "costing function", which returns an associated cost for corresponding values of the routing metrics. Exemplary routing metrics include conductor length, conductor area, and the proximity of one path to another. Based on the values of the metrics, the costing function would return a cost value, which may include circuit performance, manufacturing complexity or even the real monetary cost of a circuit so routed.

Figure 9A:
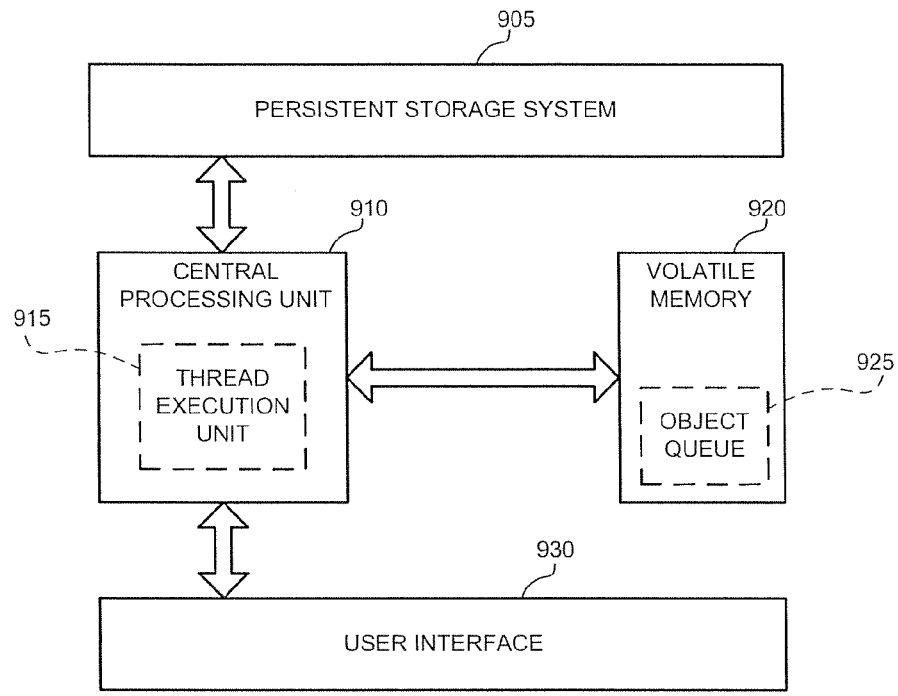
FIGS. 9A-9B are schematic block diagrams of exemplary system configurations operable to practice the present invention.
Figure 9B:
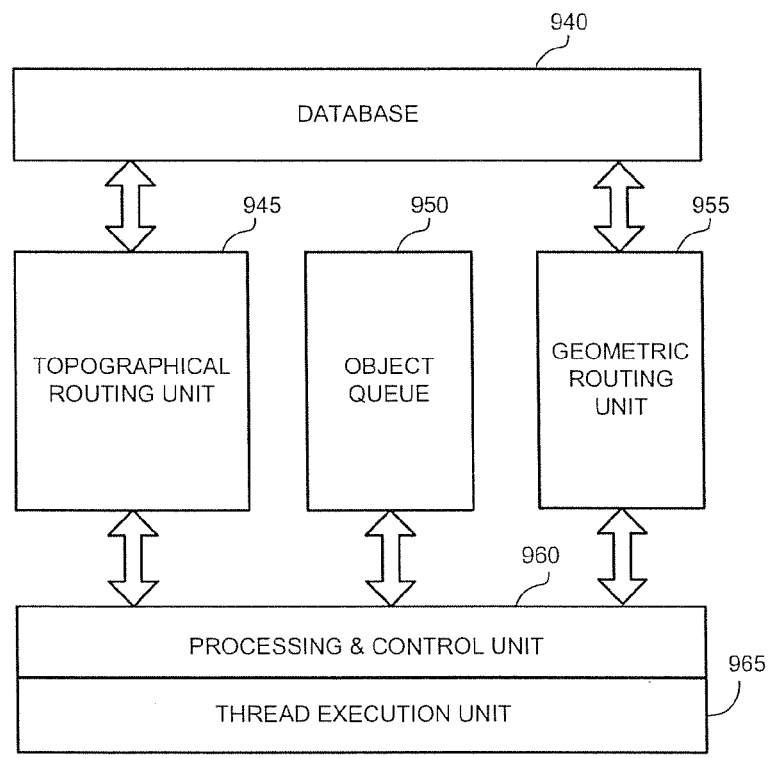

Nearly all modern routing applications (grided, gridless, shape-based and topological) for nearly all circuit design types (integrated circuit, packaging, printed circuit board) follow a basic flow for which fundamental steps are illustrated in FIG. 1. The exemplary methods described herein may also be embodied in numerous system configurations, exemplary ones of which are illustrated in FIGS. 9A and 9B. Certain references to exemplary system components depicted in FIGS. 9A and 9B will be made in the appropriate context below.

The procedure illustrated in FIG. 1 is entered at 110 and proceeds to block 120 where rats and/or nets are selected for routing. Process flow is then directed to block 130, where path finding processes determine potential routes between electrically active items in a database 940. The database 940 contains data objects collectively maintaining all pertinent data relating to the circuit design and may be formed in a persistent storage device 905. In block 140, the path resolving procedures produce wire segments that form the physical electrical connections. In the event of an overload, measures are taken to move or reroute items accordingly. As is shown at block 150, once a geometric routing solution has been constructed, a costing function may be adjusted to force certain design errors to be more expensive than in previous iterations of the procedure. Evaluation criteria, such as routing costs, are often beneficially relaxed during early routing phases to promote coarse, global routing and then increased in later iterations so that fine detailed routing will ultimately converge on an error free solution.

In each iteration of the topological routing procedure, a determination of fitness of the routing solution is made against predetermined stop criteria, as shown at block 160. For example, when all paths have been routed successfully without any design errors, the process is exited at block 170. Otherwise, the process is repeated under new constraints set by the adjusted costing function. Of course, other stopping criteria may be used for terminating the routing procedure. A typical reason for incorporating other stopping criteria is to prevent the method from iterating in an infinite loop when one or more paths are unroutable. In such instances, the method would terminate pending some corrective action or user intervention such as manual path finding or component placement procedures.

Figure 2:
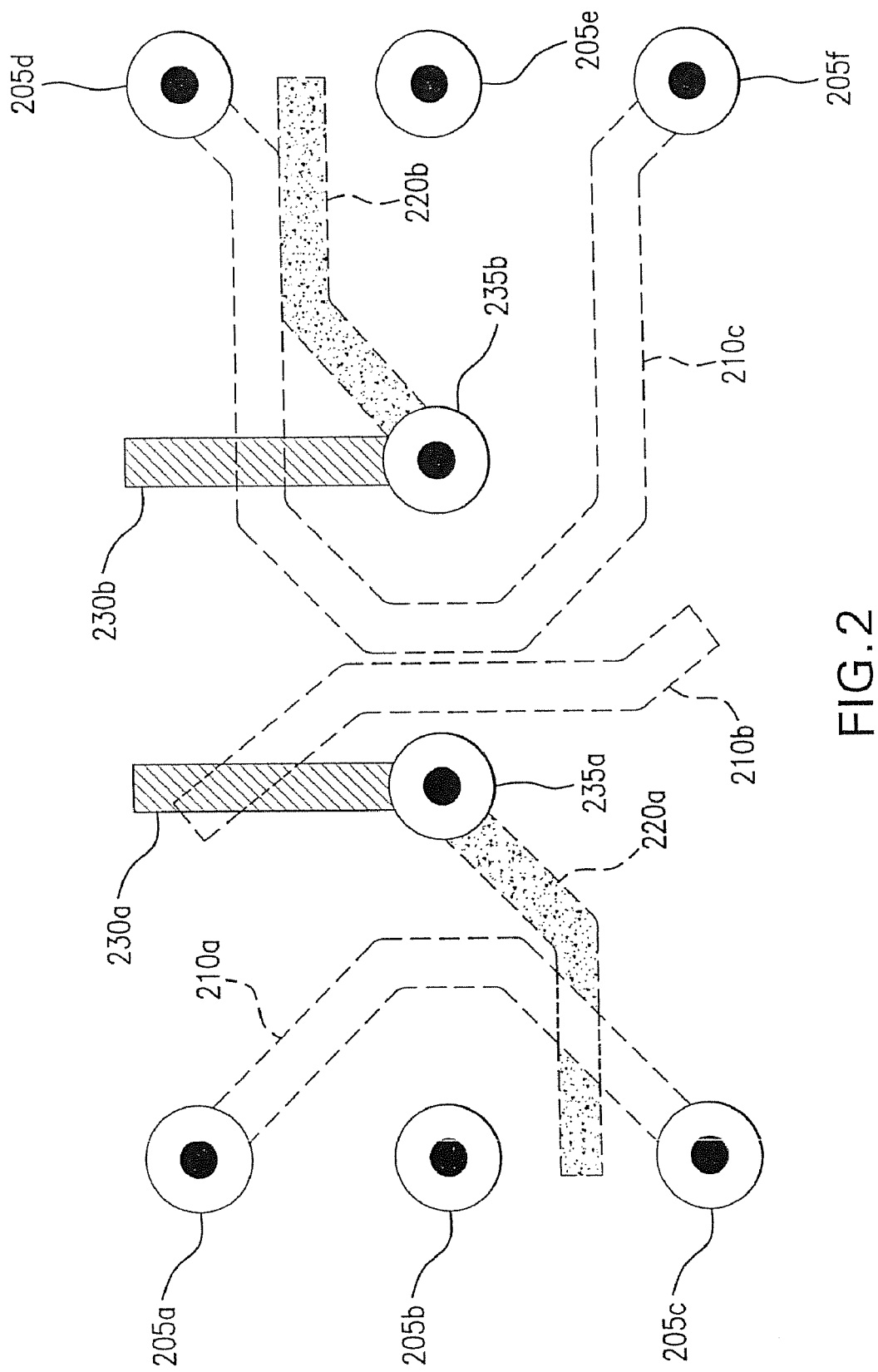
FIG. 2 is an illustration of a multi-layered geometric routing of a circuit.

A small section of a geometric routing solution is shown in FIG. 2, where pads 205a-205f represent circuit component terminals, and the pads labeled 235a, 235b represent vias. Polylines 210a-210c represent wire segments for nets on one layer, polylines 220a, 220b represent wire segments on a different layer and polylines 230a, 230b represent wire segments on yet another layer.

Figure 3A:
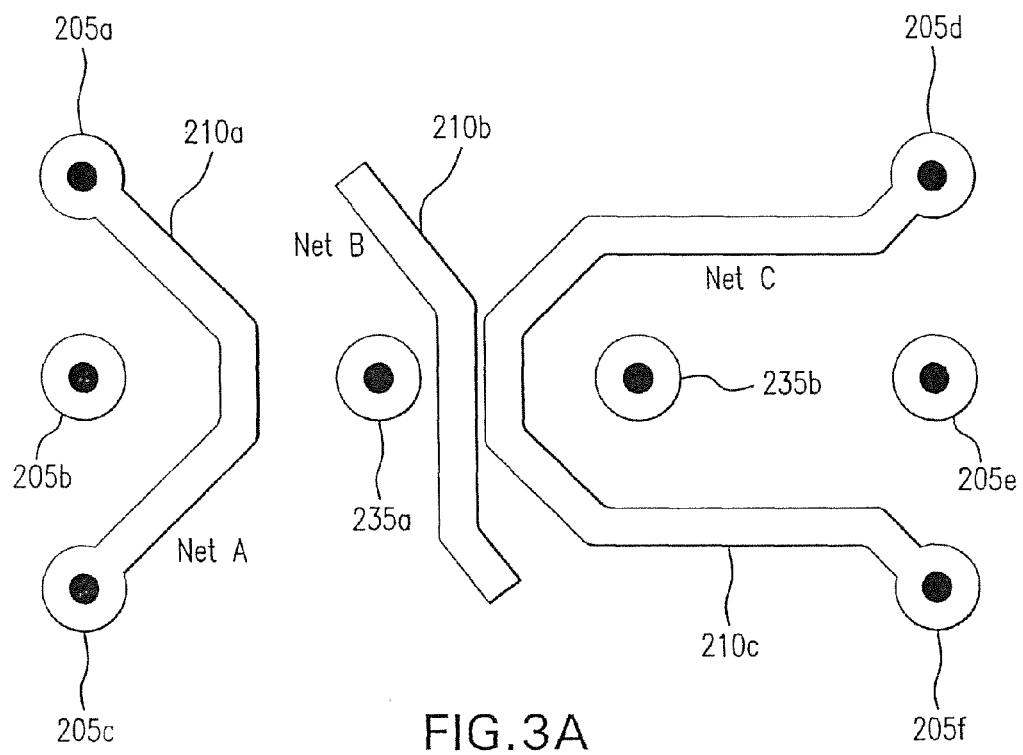
FIG. 3A is an illustration of a geometric arrangement on a single layer of the circuit routed in FIG. 2.
Figure 3B:
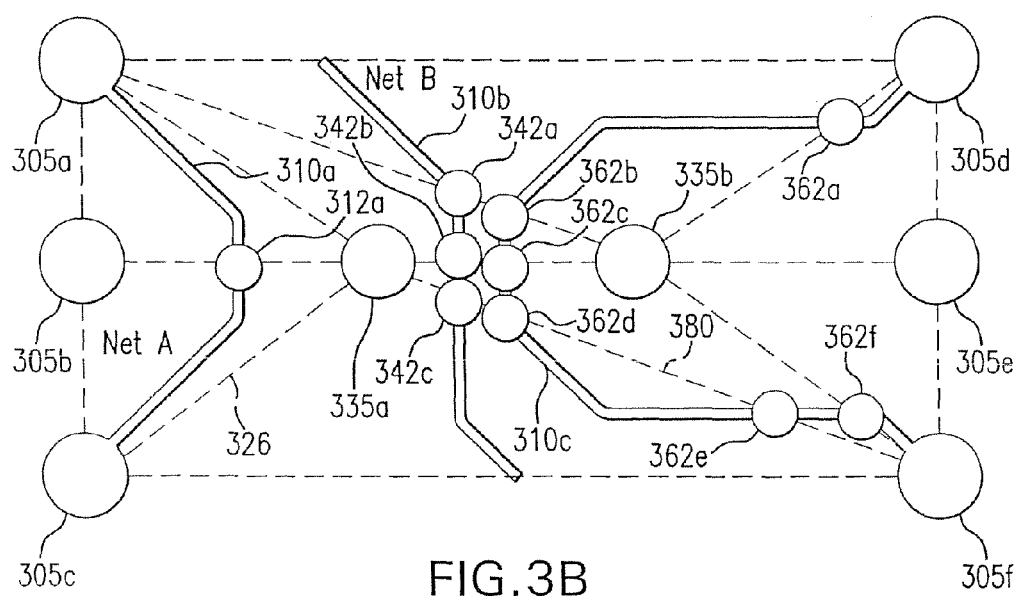
FIG. 3B is a topological graph of the geometric arrangement illustrated in FIG. 3A.

Referring now to FIG. 3A, there is shown a single layer of the portion of the geometric route shown in FIG. 2, where like reference numerals refer to like objects in both Figures. FIG. 3B is a portion of a topological plan corresponding to the geometric routing solution shown in FIG. 3A. As shown in FIG. 3B, the topological plan includes a plurality of nodes 305a-305f and 335a-335b. The nodes have extending therebetween a plurality of arcs, exemplary ones of which are shown at 326 and 380, which tessellate the routing space into a plurality of triangles. Where a ratline crosses an arc, that location is indicated by a dot, examples of which are shown on the ratline corresponding to net A, at 312a, on the ratline corresponding to net B, at 342a-342c, and on the ratline corresponding to net C, at 362a-362f. The occupancy of arc 380 is determined by dots 342c, 362d and 362e. Depending on the vacancy of arc 380 as specified by the designer, arc 380 may be overloaded. If arc 380 was determined to be overloaded, an overload resolution procedure may be executed so as to eliminate the overload condition. Exemplary overload resolution procedures are described below.

Figure 4:
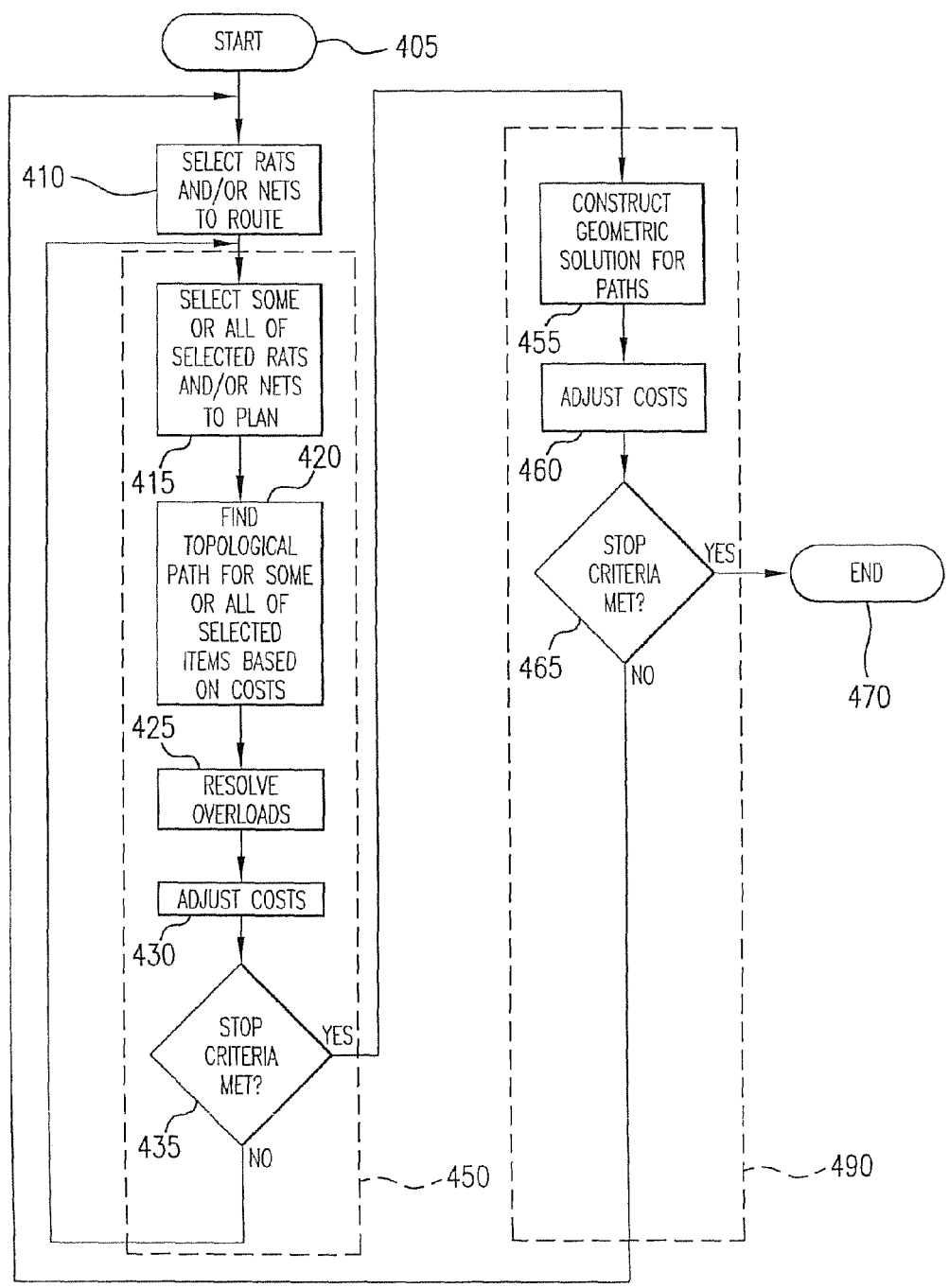
FIG. 4 is a flow diagram illustrating fundamental method steps of a topological autorouter with overload resolution.

To implement an autorouter with topological overload resolution, the basic process of FIG. 1 is altered to facilitate the elimination of overloads using topological actions or transformations. An exemplary autorouting method with topological overload resolution is illustrated in FIG. 4. The autorouter performs a topological routing phase 450 by, for example, a topological routing unit 945, in which a topological graph of the circuit is routed and in which overloads are resolved. Subsequent to the topological routing phase, a geometric routing phase 490 is executed by, for example, geometric unit 955, whereby the nets routed in the topological routing phase are realized in accordance with the coordinates of the geometric routing space. Centralized control over the autorouting processes may be achieved through a processing and control unit 960. All of the autorouting processes including the central control may be executed on an appropriate computing platform known in the art, such as depicted in FIG. 9A at central processing unit 910.

Upon entry of the method at 405, the rats and/or nets for which routing is desired are selected in block 410. In block 415, one or more of the selected rats and/or nets are selected for constructing a corresponding topological plan. The topological path routing procedure is executed at block 420 and upon its completion, as shown at block 425, any overload detected would be resolved. Flow is then transferred to block 430, whereby topological route costing functions are adjusted to increase the penalty for topological routing violations, for the purposes described above. It is then determined, at block 435, if topological routing stop criteria have been met. If not, the topological routing procedure is reiterated, with the adjusted costing function imposed, at block 415. If the stopping criteria have been met, the process proceeds to the geometric routing phase 490.

In the geometric routing phase 490, a geometric routing solution is constructed for the topological paths routed in the topological plan, as shown at block 455. Flow is transferred to block 460, where the geometric route costing functions are adjusted as described above. The geometric route stopping criteria are then evaluated at block 465 and, if met, the routing procedure is exited at block 470. Otherwise, the process is repeated at block 410.

The addition of the topological routing phase 450 may provide more rapid convergence on a solution in that path finding in the topological routing phase avoids many computationally intensive operations on objects in the geometric database. The topological plan also contains much less information than the geometric database, thereby freeing computational resources for a greater number of topological operations. This allows more iterations to be performed in less time, which is particularly beneficial for routing highly-constrained, dense designs.

The present invention implements a number of topological transformations to resolve overloads in the topological graph.

Each of the topological transformations is designed to independently perform operations that are distinct from other transformations. This feature of the present invention allows the formation of diverse overload resolution strategies not found in conventional autorouters of the prior art.

Figure 5A:
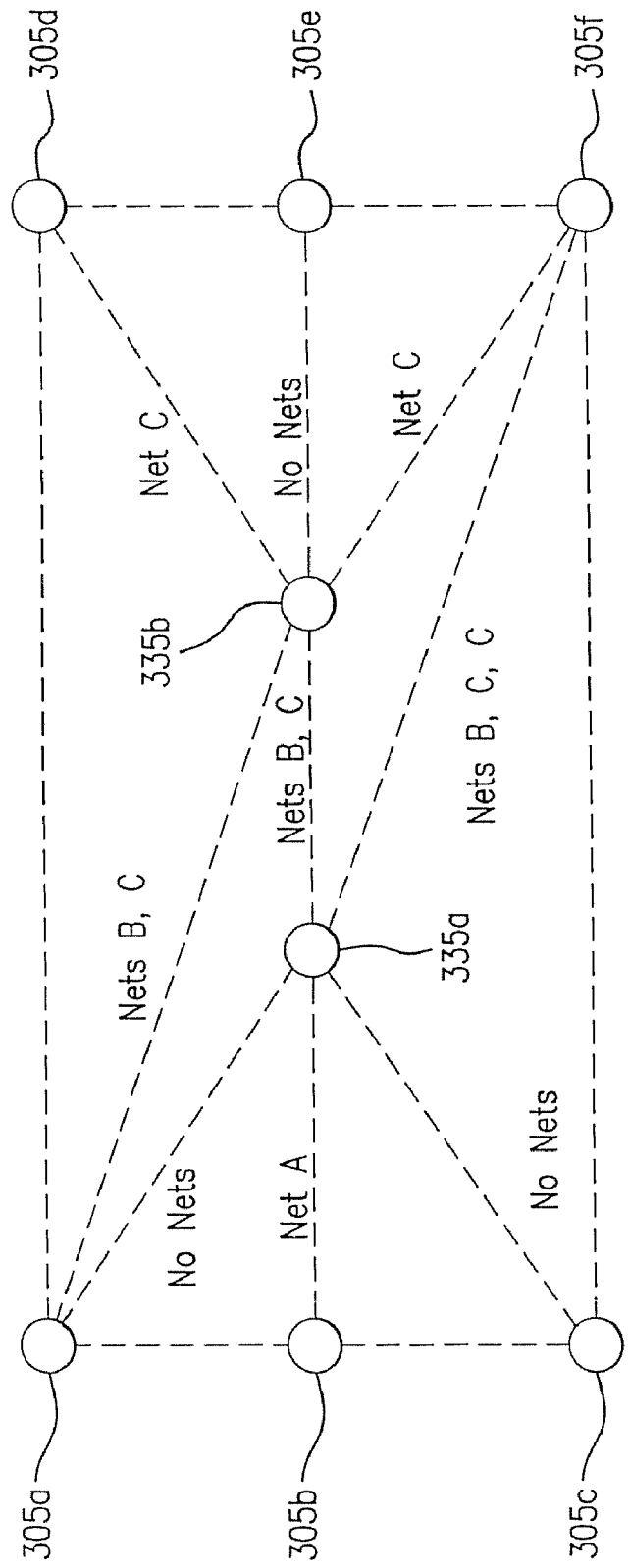
FIGS. 5A-5D are diagrams of illustrating overload resolution techniques.

Referring first to FIG. 5A, there is shown the nodes and arcs of the topological plan portion illustrated in FIG. 3B. Adjacent to each arc in the topological plan, there is listed a net designator A, B, or C, of the net crossing that arc. The arrangement presented in FIG. 5A serves as a reference for the following descriptions of the topological transformations.

Figure 5B:
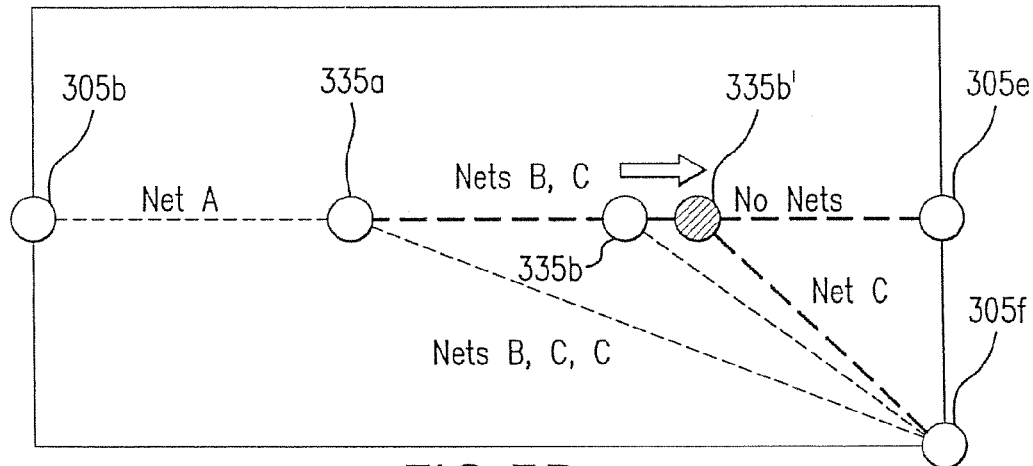

In FIG. 5B, there is shown the topological transformation previously referred to as a Shove. The Shove transformation moves a node, such as node 335*b*, to a new location, such as 335*b'*. As is shown in the Figure, by way of the Shove transformation, node 335*b*, corresponding to via 235*b* in FIG. 3A, is moved to provide more space between the nodes 335*a* and 335*b'*.

Figure 5C:
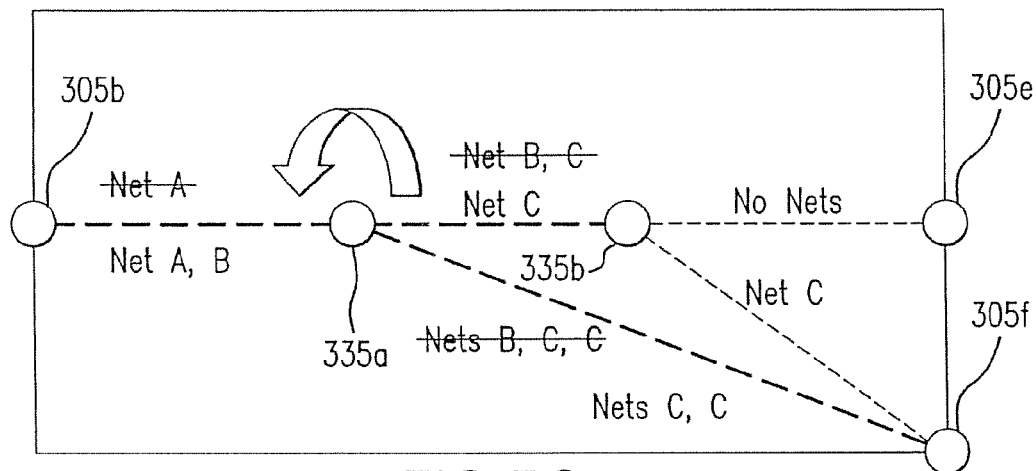

In FIG. 5C, there is illustrated the topological transformation referred to herein as a "Jump". The Jump operation moves one ratline to the opposite side of a node. In FIG. 5C, net B of FIG. 3B is moved to the opposite side of node 335*a*. After the Jump, net A and net B are then located between nodes 305*b* and 335*a* and net C is the only net routed between nodes 335*a* and 335*b*.

Figure 5D:
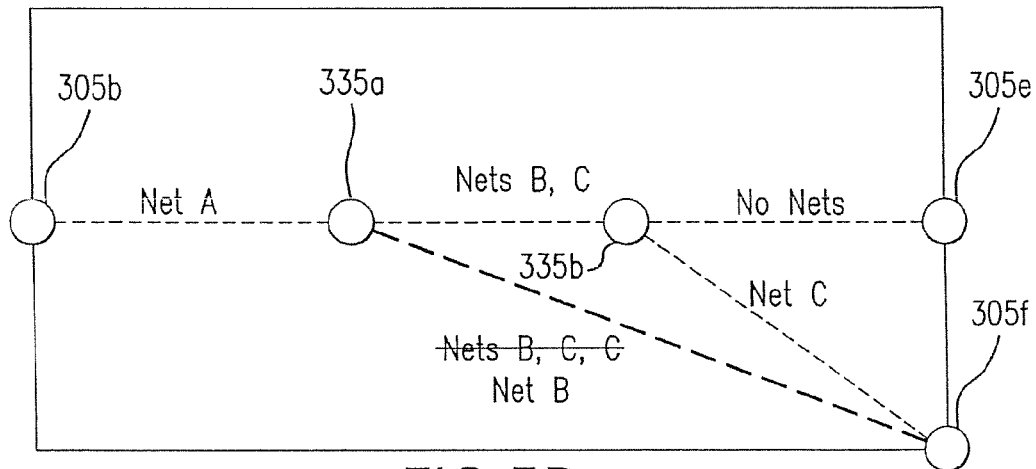

Referring now to FIG. 5D, there is illustrated the topological transformation referred to herein as an "Unwind". The Unwind operation removes a double crossing such as that of net C on arc 380. This transformation may involve multiple steps, including the rerouting of certain portions of the path so that the resultant path avoids crossing the overloaded arc.

In the discussions that follow, certain instances of the term "object" will be used to refer to container entities following the conventions of object oriented paradigms known in the art. The objects may be implemented by any known means, such as object-oriented programming and associated architecture, which are well known and will not be discussed further.

A primary objective of the topological routing phase is to determine paths for the rats in a topological plan. A master copy of all planned paths for rats is maintained in an object referred to herein as the "Topological Plan". The Topological Plan maintains a set of graphs for each layer in the design, such as that discussed with respect to FIG. 2. In the graphs, topological points are contained in objects referred to as "Nodes", which represent terminals and vias. The Nodes maintain information regarding their associated "Dots", objects which contain information on corresponding dots. A Dot is used to represent where "RatLine", which is an object maintaining information of a ratline, is topologically planned cross a "Cut", an object containing information on an arc and which is described further below. A "Rat" object containing information on a rat is defined by a series of RatLines. A "Net" is an object maintaining information on a net and is defined by a set of connected RatLines.

Information defining the arcs of a topological graph, such as that indicated at 326 and 380 of FIG. 3B, are contained in objects referred to herein as "Cuts". Each Cut connects exactly two Nodes and knows its capacity (its total available space), its occupancy (total space required by the RatLines passing through it) and vacancy (the difference between capacity and occupancy). If the vacancy of a Cut is negative, the Cut is set to be overloaded. Cut objects also maintain information on their associated plurality of Dots representing the RatLines that are planned through that Cut.

In certain embodiments of the present invention, two types of Cut objects are implemented: Explicit Cuts and Implicit Cuts. The Explicit Cuts form a plurality of triangles that tessellates the routing space. Every potential geometric location on the graph is then identifiable according to exactly one of three possibilities: it is on a Node, it is on a Cut, or it is inside exactly one triangle defined by the Explicit Cuts.

Figure 6A:
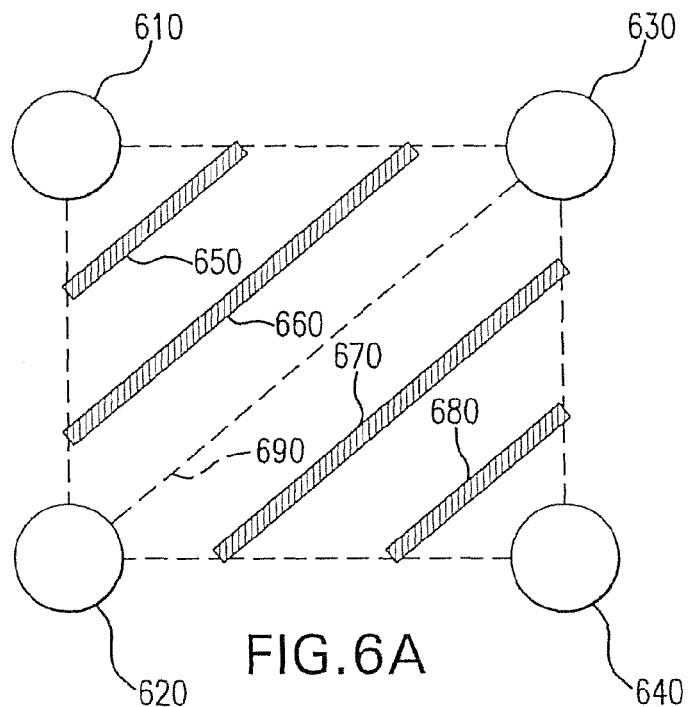
FIGS. 6A-6B are illustrations of an exemplary overload condition.
Figure 6B:
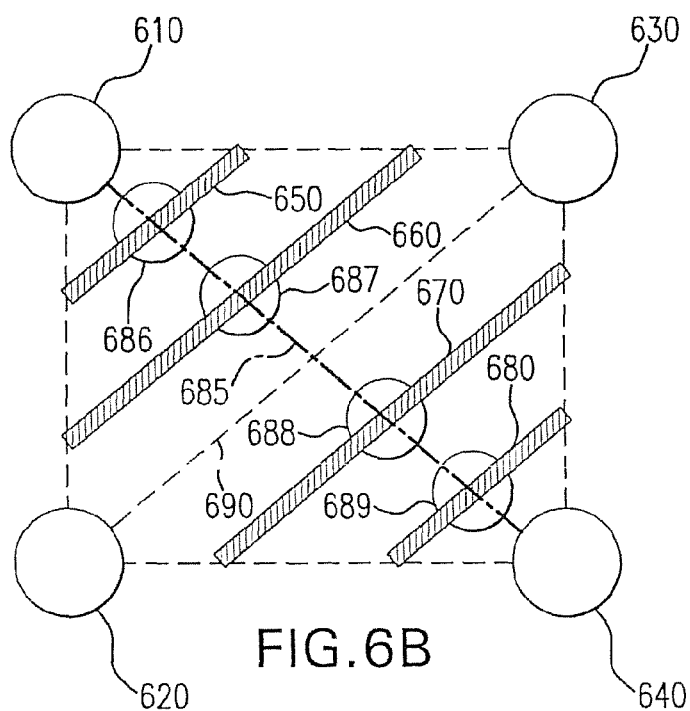

In certain embodiments of the invention, the path finding mechanism utilizes the vacancy information stored in the Explicit Cut object. Often, however, the Explicit Cut objects do not store sufficient information to recognize all variations of an overload condition. For example, in the situation depicted in FIG. 6A, a plurality of Nodes 610-640 forms a rectangle having a diagonal Explicit Cut 690 extending between nodes 620 and 630. The rectangle has passing through it a plurality of RatLines 650-680. If the design criteria are defined such that only two RatLines are allowed to pass through any side of the rectangle and that any diagonal Cut is allowed only three wires, then the configuration of FIG. 6A would appear to meet that design criteria. However, if a Cut is provided across the rectangle extending from Nodes 610 and 640, as shown in FIG. 6B, then the RatLines 650-680 all cross the newly created Cut 685 at 686-689, respectively. This condition violates the previously defined design criteria and it is said that the Cut 685 is overloaded.

To ensure that the design criteria are strictly met, certain embodiments of the present invention implement a new data object referred to as an "Implicit Cut". The Implicit Cut is used to store information regarding the capacity, occupancy and vacancy between any pair of Nodes. An Implicit Cut is considered overloaded when the total occupancy by all the RatLines planned between its pair of Nodes exceeds the total capacity specified by the designer. Each Implicit Cut is able to determine the RatLines that are planned across it by, for example, traversing a series of Explicit Cuts between its two Nodes and retrieving their Dots. The Dot object will, in such implementations, maintain a reference to the RatLine that crossed the Explicit Cut to instantiate the Dot. The Implicit Cut may then determine which, if any, of these RatLines crosses it.

Various features of the present invention are best illustrated by describing an exemplary embodiment of an overload resolution method for use in a topological autorouter, such as that described in conjunction with FIG. 4. In the exemplary embodiment, the overload resolution procedures have three abstraction levels: "Directors", "Strategies" and "Actions". Overload resolution Directors accept a high-level, global objective, such as an entire design contained in a "Design" object, circuit pads or vias contained in a "Terminal" object, or a rat contained in a Rat object and control the overall process of eliminating the overloads associated with that objective. Directors are also responsible for deciding where to check for overloads and which overloads to attempt to resolve. Overload resolution Directors are also responsible for providing feedback to the path selection costing mechanism for any overloads that were not resolved.

Overload resolution Strategies accept a particular object that is or might be overloaded and attempts to resolve that overload by using topological transformations, such as those previously described. The results of any particular series of topological transformations are stored in a "Context", an object which maintains topological information about a localized region of the topological graphs. It is an objective of a Strategy to find a Context that has a lower overload than the original Context without increasing the overall cost. Additionally, Strategies are responsible for determining the order in which various Actions are attempted.

Overload resolution Actions perform a particular topological transformation, such as a Jump, Shove or Unwind, starting with an existing Context and storing the results in a new Context. Each Action creates a temporary model for the changes to the local topology using "Struts" and "Joints", which are described in the paragraphs that follow.

While a Strategy is running Actions, any resultant information is stored in Context objects. In the exemplary embodiment, there are two types of Context objects: Original Contexts and Cloned Contexts. The Original Context object maintains a graph of the original Joints and original Struts representing Nodes and Cuts in the topological plan prior to any changes.

Figure 7A:
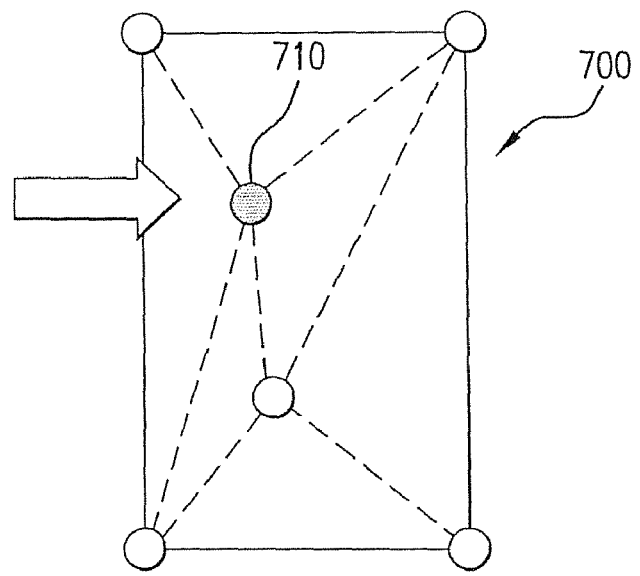
FIG. 7A is an illustration of a Joint of the present invention.

Referring now to FIG. 7A, there is shown a representation of a Joint object 710 in a portion 700 of a topological plan. The Joint object maintains a topological point that represents one or more Nodes at that same location in the topological plan. Every Cloned Joint knows both its parent Joint and its original Joint.

Figure 7B:
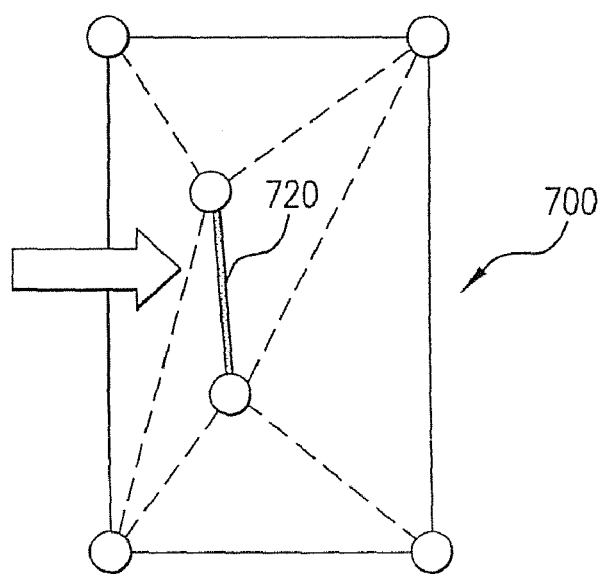
FIG. 7B is an illustration of a Strut of the present invention.

A Strut object contains information about an arc represented by a Cut. Referring to FIG. 7B, there is shown a representation of a Strut 720 in a portion 700 of the topological plan. Each Cloned Strut knows its original Strut. Additionally, any Joint can determine the Node objects associated with it and any Strut can determine the unique Cut object associated with it.

A Cloned Context object knows the Action (e.g., Shove, Jump or Unwind) which caused its instantiation as well as its parent Context, which may be either the original Context or another Cloned Context. It may also maintain lists of Cloned Joints and/or Cloned Struts that were modified by the Action.

As previously described, the Director governs the high-level control of the exemplary overload resolution process. The Directors process is very simple: select what high-level persistent data objects to process, e.g. Designs, Rats and Terminals, and then process them. In certain embodiments of the present invention, the data objects are stored in a database and are processed sequentially by the following steps: selecting an overloaded object or potentially overloaded object; placing the overloaded object in a queue; while the queue is not empty, remove one object from the queue; call an appropriate Strategy to resolve any overloads; and if new overloads are created by an Action of the Strategy, the overloaded object is added to the end of the queue. The process is repeated for as long as is necessary to meet a particular objective.

Variations of the Director component are possible, the variation determining the selection of which overloaded object to process. For example, a ResolveDesignDirector processes an entire design held in a Design object. It can either resolve only overloads known to exist or it can process every Terminal in the entire design to search for all overloads. Resolving known overloads is a relatively fast process, but potentially misses unknown overloads on Implicit Cuts.

Another variation of the Director component is the ResolveRatDirector which processes one Rat object containing information on a path between two Terminals on one or more layers. The ResolveRatDirector scans all Explicit Cuts, Implicit Cuts and Terminals that the Rat crosses. In an "All" mode, the ResolveRatDirector selects all of the Explicit Cuts and Terminals and adds them to the list of objects to be processed. In its "Known" mode, the ResolveRatDirector selects only Explicit Cuts and Implicit Cuts whose vacancy is negative. A ResolveRatLineDirector is another variation of the Director component and is similar to the ResolveRatDirector but works with a RatLine.

Figure 8:
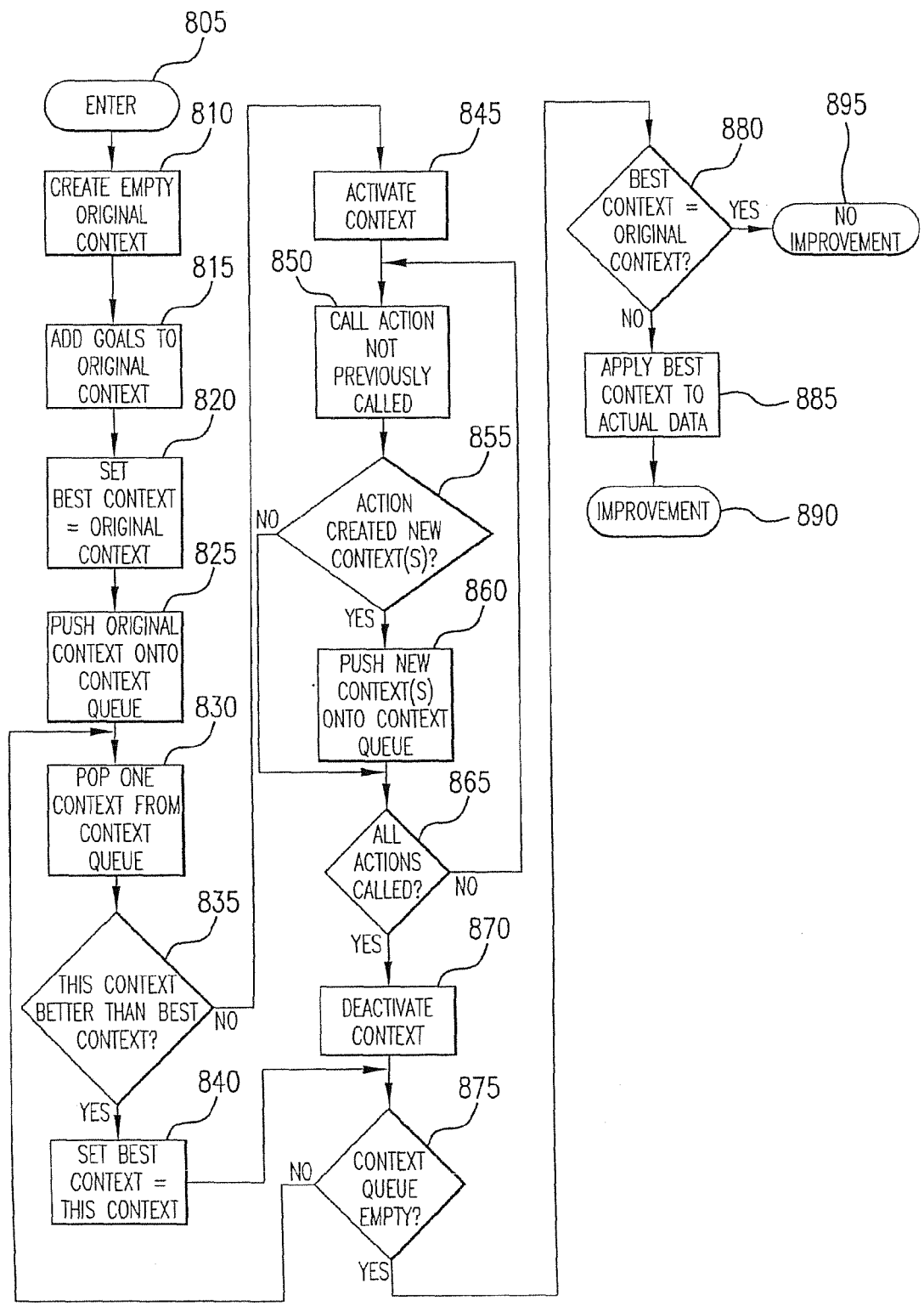
FIG. 8 is a flow diagram illustrating fundamental method steps for an exemplary overload resolution technique of the present invention.

Whereas it is the responsibility of the Director component to select objectives for which overloads are to be resolved, it is the Strategies that determine how the overloads are to be resolved. FIG. 8 illustrates by way of a flow diagram an exemplary embodiment of such a Strategy.

As is shown in FIG. 8, the Strategy is entered at block 805 and flow is transferred to block 810, where an empty Original Context object is created. The Strategy creates a local graph containing information about the Topological Plan and the proposed changes that are being considered and stores the information in the Original Context object. The local information is stored as Joints and Struts, which in themselves contain condensed information from the Nodes and Cuts from which they originate. Each Joint and Strut also includes references to the original Nodes and Cuts used to create them.

To improve performance, the Original Context implements lazy evaluation where, rather than creating an entire Original Context containing the entire Topological Plan, only those areas that are needed by the procedure are created. Additions to the local graph are not made until needed.

At block 815, goals are added to the Original Context created in block 810 and are stored in "Goal" objects. At this step, the particular Strategies form an objective. For example, one Strategy would be to resolve a particular overloaded Cut, be it an Explicit Cut or Implicit Cut. For this Strategy, incomplete Original Joints are created for the two Nodes that mark the ends of the Cut. Then, an Original Strut is created between them. This Original Strut is added to a list of overloaded objects represented as Goals.

Another Strategy may be to resolve a particular Terminal. For this Strategy, an Original Joint is created and associated with each of the Terminal's Nodes on each Layer. The Original Joint is then "completed", i.e., creates a complete set of Original Struts for the Original Joint. Each of the Struts is then examined and if any are overloaded, they are added as Goals. If none are overloaded, then the Terminal is not overloaded, so the Strategy returns without doing any work.

Yet another exemplary Strategy would involve checking a pair of Terminals for overloads and resolving any overloads that are found. This would be used if, for example, unknown overloads on Implicit Cuts are created when installing a new path. For this case, two complete Original Joints are created and all of their Struts are checked for overloads.

Once the Goals have been added to the Original Context, flow transfers to block 820 whereby a variable maintaining a best Context is set to the Original Context that was just initialized. The Original Context is then added to a Context queue, as shown at block 825. The Context queue is an assemblage of Context objects arranged in, for example, a queue 950 of objects on which overload resolution procedures are to be conducted. The Context queue may be structured in a variety of forms as an object queue 925 in, for example, volatile memory 925. Exemplary forms of the Context queue include the well-known first-in first-out (FIFO) stack traditionally known in the art, or the well-known first-in last-out linear queue. The Context queue may accept insertion of a Context object anywhere in the queue, but pops a Context object only from the front of the queue.

In certain embodiments of the invention, the Context queue is structured to carry out overload resolution in a predefined search order. Such a Context queue may be established as a "Priority" queue, in which Context objects are placed in the queue according to an assigned priority. In a Priority queue, each Context object is assigned a priority and is placed on the queue in accordance therewith, e.g., prior to a Context object having a lower priority and after a Context object in the queue whose priority is higher. The Context object that is popped off of the queue is then that having the highest priority.

Various attributes of the Context object or search characteristics may be used as the priority. For example, if the cost associated with the Context object is used as the priority, a cost-based search order follows by operation of the Priority queue. The Priority queue may be ordered such that Context objects of lower cost are assigned a higher priority. Then, once a solution is found, the Context object having the highest priority has, by definition, the lowest cost. No other sorting operation is required to locate the Context object with the lowest cost, as is required by traditional iterative or recursive search techniques. Of course, other parameters may be used as the priority to establish other search orders.

Once the Original Context has been pushed onto the queue, it is popped off of the queue, as shown at block 830. In subsequent iterations of the procedure, other Contexts will be pushed onto the Context queue and one of those Contexts will be popped from the queue at step 830. If the Context queue is of a stack nature, the last Context pushed onto the queue will be removed therefrom. Alternatively, if the queue is of a first-in, last-out structure, the next Context in the queue will be removed, while the just created Context will be pushed onto the end of that queue. Alternatively, if the queue is a Priority queue, the just created Context object will be added to the queue before any other Context object having a lower priority.

The Context is then evaluated, at block 835, for improvement in one or more of its cost characteristics. To determine a best Context, the concept of "better" must be defined on Contexts and that definition has a direct impact on the quality of solutions. Thus, to find the "best" solution, an ordering rule must be developed and applied.

A partial ordering can be achieved by means of a binary comparison operator that meets the following two rules: for any three values, a, b and c, if $a \leq b$ and $b \leq c$, then $a \leq c$; and, for any two values, a and b, if $a \leq b$ and $b \leq a$, then $a=b$. The first of these requirements may be achieved, for example, by computing a numeric goodness value for each Context. For example, the current Context may be compared to the Original Context by a differencing function, which may be performed by constraint handlers routing the topological graph. Since two Contexts may have the same suitability with respect to constraint compliance and still be different, this comparison alone would not be sufficient, in that it does not meet the equivalence requirement. An additional measure must be added, for example, by comparing every Joint and Strut in two Contexts for equality. Unfortunately, this evaluation would be extremely slow.

An alternative method would be to use checksums. For each Joint and each Strut, a checksum is maintained which takes into account various aspects of the objects, such as the location of the Joint and/or the ordering of RatLines on a Strut. The checksum for the Context could then be the sum of the checksums of its objects. The comparisons may then proceed by evaluating two integers, i.e., the checksum values for each Context to determine the ordering. This also allows for Contexts which are equal to be designated as such.

A partial ordering may suffice in certain applications, however, in others, the absolute "best" solution must be determined. As such, a linear ordering is desired. A linear ordering contains the partial ordering rules and a further constraint that for any two values, a and b, exactly one of the following is true: $a<b$, $a=b$ or $b<a$. One way to achieve a linear ordering is to ensure that the cost function is monotonically increasing, i.e., every Context involves a larger cost than its parent Context. This costing may be tracked by breaking the cost function into fields, for example, constraint-gains, constraint-losses, length-gains, and length-losses. If any cost metric value goes up as compared to a previous Context, the constraint-gains field is incremented by the amount of increase. If the constraint goes down, that value is subtracted from the constraint-losses field. An exemplary ordering function, then, returns the ordering for the first field that is not equal. Additional comparisons could be made such as a determination of the number of Joints moved, the number of Struts modified, the number of Actions performed, etc., to ensure a linear ordering. Such may be required, because costs may be equal for two different Contexts, but one of the solutions may be preferred over the other solution for reasons other than cost.

To further ensure that a linear ordering is guaranteed, a tie breaker may be applied. For example, every Joint and Strut may be considered by defining a linear ordering on just those objects alone. Their particular ordering does not necessarily have bearing on the quality of the routing solution, in that the evaluation is only used as a tie breaker. Alternatively, a comparison of the checksums, as described above, may be possible.

If, at block 835, it is determined that the Context being evaluated is better than the currently best Context, then the variable maintaining the best Context is set to the current Context. However, if the Context is not the best Context, flow is transferred to block 845 where the Context is activated, i.e., it is prepared for processing.

Each Context object contains a list of Joints belonging to that Context; an Original Context contains a list of only the Original Joints and a Cloned Context contains a list of only Cloned Joints. The present invention provides means for efficiently finding Cloned Joints that are a part of the Cloned Context or, if a Cloned Joint does not exist for the current Cloned Context, the Original Joint can be found quickly and cloned for the current Context.

At any time during processing of a Cloned Context, Joints designated to have an Action performed on them are first queried as to their Active Joint, which is the Joint object designated for processing by the Action. The Original Joint knows whether an Active Joint exists for the Joint being scrutinized and, if one does exist, will return the Active Joint upon being queried for such by a Joint. If an Active Joint does not exist for the current Cloned Context, the Original Joint clones itself to create a Cloned Joint for the current Cloned Context and the newly Cloned Joint is set as the Active Joint and returned to the requestor.

Thus to prepare the Context for processing, i.e., activate the Context, all of the Joints belonging to the Context are traversed and the Original Joint for each Joint is visited. The Original Joint is then configured to return the current Joint being traversed as the Active Joint. By doing so, all Joints in the Original Context Object will be processed by the Action.

Once the Context has been activated, the method proceeds to block 850 whereby an Action is called that was not previously performed on this particular Context. An overloaded Strut may be resolved by means of a Jump, i.e., one of the RatLines is moved to the other side of a Joint, a Shove, i.e., one of the Joints is moved in an advantageous direction or an Unwind, i.e., where a double-cross of an arc is removed. For a Jump, either the first RatLine is moved over the first Joint or the last RatLine is moved over the second Joint defining the two ends of the Strut. An Unwind scans each RatLine of the Strut and if the RatLine is encountered more than once, then the Context is cloned, but the duplicate RatLine is not cloned into the Cloned Context.

The Shove Action provides a number of alternatives for resolving the overload. A Shove can be accomplished by moving either or both Joints of an associated Strut.

In certain embodiments of the present invention, a Joint may be Shoved in one of a plurality octolinear directions relative to the overloaded Strut being resolved, 0°, 45°, 90°, 135°, 180°, 225°, 270° and 315°. For any particular Joint and Strut combination, only three of these directions are applicable, i.e., the directions that lengthen the overloaded Strut connected to the Joint being moved.

In alternative embodiments, the overloads on all Struts of the Joint can be added through the use of weighted vector addition to find a direction and distance in which to move the Joint.

To avoid infinite loops, checks may be established that prohibit the same Shove Action from being attempted more than once. This may be achieved by placing markers on the Joints to indicate what Shoves have been attempted. Alternatively, in a simpler approach, the parent Context objects may be scanned to see if currently scheduled Actions have been attempted in a previous Strategy.

The results of an Action will create a new Context object if the Action resulted in a change to the overload condition. If such a case is determined at block 855, the newly created Context is pushed onto the Context queue, as illustrated at block 860. It is then determined if all Actions have been called on a particular Context, which is determined at decision block 865. If other Actions are to be called, the process is repeated beginning with block 850.

The present invention advantageously attempts a plurality of Actions on a Context and then determines in subsequent evaluation, such as that discussed with reference to block 880, which Context object is best in terms of some criteria, such as cost. Overloads are thereby removed in the more fluid topological routing phase to greater effect than in prior art methods.

If the Strategy has completed all of its Actions on the Context object, as shown at block 870, the Context is deactivated, which essentially undoes the Activate Context step previously described. For the Context being processed, all Joints belonging to the Context are visited and for each Joint, the corresponding Original Joint is set to indicate that no Active Joint exists.

The process proceeds to decision block 875, where it is determined if the Context queue is empty. If there are Context objects still on the queue, the next Context is popped at block 830. Otherwise, if it is determined, as shown at 880, that the variable maintaining the best Context is still equal to the Original Context, the process returns that no improvement was found and exits at block 895. Otherwise, the process proceeds to block 885, where a walk-back test is applied on the best Context to retrieve what Actions were performed that resulted in making it the best Context. These same Actions are then applied to the actual data, as referred to by the Joints and Struts of the Context Object. The process then returns that improvement had been made, as shown at block 890.

In certain instances, the overload resolution Strategy will be unable to resolve a topological overload condition. In certain embodiments of the invention, the information on the topological region containing the unresolved overload will be stored in an object and passed to another Strategy to find a new path that avoids the overloaded region. Such a Strategy may invoke a single connection router or some manual routing procedure to construct the new path.

The processes of the present invention support fine-grained multi-threading, and, in certain embodiments, Context objects may be processed concurrently in parallel. The Context may be incorporated into an executable thread and processed by a multi-threading capable processor, such as illustrated by thread execution unit 915 in central processing unit 910, or at thread execution unit 965. Such implementation generally requires one or more mechanisms to prevent concurrent memory access by competing threads. In certain embodiments, a memory locking is applied during certain memory accesses, such as the Context popping operation, after which the other steps can be run independently of the memory lock. This is implemented, in certain embodiments, by making the Joints and Struts from all parent Contexts read-only. Context objects are instantiated upon running an Action on a prior Context and the results of the Action are stored in the new Context object. All Contexts created after the Original Context are cloned from the Original Context and a Cloned Context can only be written to while its Action is being run. Upon completion of the Action for which the Cloned Context is storing information, the Cloned Context becomes read-only for the rest of the procedure. This strategy of only allowing Cloned Context to be written to during their Action prevents errors in certain multi-threaded implementations of the procedure. Alternative processes known in the art may be used to synchronize access to shared memory by multiple threads.

The descriptions above are intended to illustrate possible implementations of the present invention and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalence.

What is claimed is:

1. A method for providing routes between terminals of a net via a topological routing phase and a geometric routing phase, the method comprising:
   executing the topological routing phase prior to executing the geometric routing phase, the topological routing phase including:
      tessellating a routing space by a first plurality of arcs, each of said arcs extending between a corresponding pair of nodes each indicative of a corresponding one of the terminals;
      routing in said routing space a topological graph of the net;
      performing a plurality of occupancy reducing actions on a portion of said topological graph containing an arc having an occupancy greater than a predetermined threshold, each of said occupancy reducing actions performing operations distinct from remaining ones of said plurality of occupancy reducing actions; and,
      modifying said topological graph to incorporate topological differences between an occupancy reduced portion of said topological graph resultant from at least one of said occupancy reducing actions and said portion of said topological graph; and,
   executing said geometric path routing phase to route said geometric arrangement of the net in accordance with said topological graph.

2. The method as recited in claim 1 further including:
   tessellating said routing space by a second plurality of arcs; and
   performing said plurality of occupancy reducing actions on a portion of said topological graph containing an arc of said second plurality of arcs having an occupancy greater than a predetermined threshold.

3. The method as recited in claim 2, where said tessellating by said second plurality of arcs includes tessellating said routing space such that none of said second plurality of arcs extends between an identical pair of nodes corresponding to any of said first plurality of arcs.

4. The method as recited in claim 1, further including:

creating a context object corresponding to said portion of said topological graph containing said arc having an occupancy greater than said predetermined threshold;

performing said plurality of occupancy reducing actions on said portion of said corresponding topological graph in said context object and producing thereby a plurality of context objects each containing said corresponding portion of said topological graph as transformed by a corresponding one of said plurality of occupancy reducing actions;

cloning any of said context objects containing in said corresponding portion of said topological graph an arc having an occupancy greater than said predetermined threshold;

performing said occupancy reducing actions on said portion of said topological graph corresponding to said cloned context objects;

selecting a context object in accordance with a first predetermined criterion, said selected context object corresponding to said occupancy reduced topological graph.

5. The method as recited in claim 4, where said selecting said context object includes establishing as said first predetermined criterion a predetermined position in a linear ordering of characteristics of a context object.

6. The method as recited in claim 5, where said creating said context object creating includes including in said context object an indication of one of said occupancy reducing actions, said one of said occupancy reducing actions having associated therewith a routing cost function.

7. The method as recited in claim 6, where said establishing said first predetermined criterion includes establishing as said linear ordering a linear ordering of a functional range of said routing cost function.

8. The method as recited in claim 7, where said selecting said context object selecting includes selecting a context object having a minimum value of said linear ordering of said routing cost function.

\* \* \* \* \*